(12) United States Patent
Ding et al.

(10) Patent No.: US 8,514,028 B2
(45) Date of Patent: Aug. 20, 2013

(54) LOAD TOLERANT VOLTAGE CONTROLLED OSCILLATOR (VCO), IC AND CMOS IC INCLUDING THE VCO

(75) Inventors: Hanyi Ding, Colchester, VT (US); Pinping Sun, Essex Junction, VT (US); Hailing Wang, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 13/211,697

(22) Filed: Aug. 17, 2011

(65) Prior Publication Data

US 2013/0044838 A1    Feb. 21, 2013

(51) Int. Cl.
*H03B 5/12* (2006.01)

(52) U.S. Cl.
USPC .............. 331/117 FE; 331/108 D; 331/113 R (58) Field of Classification Search
USPC ................ 331/108 C, 108 D, 113 R, 117 FE, 331/117 R, 167
See application file for complete search history.

(56) References Cited

U.S. PATENT DOCUMENTS

| | | | | |
|---|---|---|---|---|
| 6,433,609 B1 * | 8/2002 | Voldman | | 327/313 |
| 7,049,898 B2 * | 5/2006 | Banerjee et al. | | 331/108 C |
| 7,132,901 B2 * | 11/2006 | Cojocaru | | 331/117 FE |
| 7,382,206 B2 * | 6/2008 | Park et al. | | 331/182 |
| 7,420,260 B2 * | 9/2008 | Kwon et al. | | 257/547 |
| 7,545,230 B2 | 6/2009 | Jang et al. | | |
| 7,989,875 B2 * | 8/2011 | Noort et al. | | 257/318 |
| 2009/0179695 A1 * | 7/2009 | Siprak et al. | | 327/551 |
| 2010/0093162 A1 * | 4/2010 | Yakuwa | | 438/527 |
| 2011/0018646 A1 | 1/2011 | Lee et al. | | |

OTHER PUBLICATIONS

Kim et al., "A very low power quadrature VCO with backgate coupling", "IEEE Journal of Solid State Circuits", 6, Jun. 2006, vol. 39.
Liu et al., "Low Phase Noise Load Independent Switched LC VCO", "IEEE MTT-S Int'l Microwave Symposium (IMS)", May 1, 2010.
Rai et al., "A 600 uW BAW-Tuned Quadrature VCO Using Source Degenerated Coupling", "IEEE Journal of Solid-State Circuits", Jan. 1, 2008, vol. 43, No. 1.
Tsai et al., "A Low-power Quadrature VCO Using Current-reused Technique and Back-gate Coupling", "Piers Online", Jan. 7, 2007, vol. 3, No. 7.

* cited by examiner

*Primary Examiner* — Levi Gannon
(74) *Attorney, Agent, or Firm* — Law Office of Charles W. Peterson, Jr.; H. Daniel Schnurmann (57) ABSTRACT

A voltage controlled oscillator (VCO), IC and CMOS IC including the VCO. The VCO includes an LC tank circuit, a pair of cross-coupled devices connected to the tank circuit and driving a pair of buffers. Each of the pair of cross-coupled devices includes a field effect transistor (FET) with an independently controllable body, e.g., the surface layer of a Silicon on Insulator (SOI) chip or the surface well of a multi-well chip. Diodes in the multi-well structure are biased off in each device. The tank circuit is coupled to the buffers solely through the FET drain to body capacitance.

20 Claims, 6 Drawing Sheets

| with 50um load buffer | Prior Art VCO | The Preferred VCO |
|---|---|---|
| Frequency (GHz) | 15.58 | 19.19 |
| Tuning range | 9.60% | 10.43% |
| Power Supply(V) | 0.6 | 0.6 |
| Current Consumption(core)(mA) | 3 | 3 |
| Phase Noise@1MHz (dbc/Hz) | 102.7 | 106 |
| FOM | 181 | 191.9 |

LOAD TOLERANT VOLTAGE CONTROLLED OSCILLATOR (VCO), IC AND CMOS IC INCLUDING THE VCO

BACKGROUND OF THE INVENTION

1. Field of the Invention

The present invention generally relates to voltage controlled oscillators (VCOs), and more particular, to VCOs used as local oscillators on integrated circuit (IC) chips.

2. Background Description

Increasingly, electronic communications, both wired and wireless (e.g., WiFi), are digital. In digital communications a serial data string of ones ("1"s) and zeros ("0"s) modulate a carrier frequency ($f_c = \omega_c / 2\pi$) that is transmitted unidirectionally or bidirectionally. Bidirectional communications require a transmitter and receiver (transceiver) at each end to transmit/receive the communications signals. A suitable digital communications transceiver also includes a local modulator-demodulator (modem) capability. Modulating and demodulating requires a local radio frequency (RF) source, e.g., a local oscillator (LO), providing a true replica of the carrier frequency.

A tank circuit, a capacitor (C) connected to an inductor (L), oscillates at its resonant or natural frequency ($f_0$, where $\omega_0^2 = 1/LC$), determined by the tank circuit capacitance and inductance. An ideal tank circuit (just L and C) will oscillate purely sinusoidally at its natural frequency, indefinitely. Since nothing is ideal, all tank circuits include resistance (R). Inductor current lags voltage and capacitor current leads voltage by ninety degrees (90°). Thus, because resistor current is in phase with voltage across the resistor, tank circuit resistance shifts the phase ($\Delta\omega$) in the tank circuit, dampens the tank circuit oscillation, and determines what is known as the tank circuit's Q factor or Q.

Therefore, typical state of the art oscillators require regenerative feedback to maintain oscillation. Phase noise is a measure of signal spread (and Q) and satisfies $L(\Delta\omega) = 4FkTR/V_{RMS}^2 * (\omega_0/2Q\Delta\omega)^2$, where k is the Boltzman constant, T is the operating or ambient temperature, $V_{RMS}$ is the root mean square of the tank circuit voltage, and $F = 1 + (4\gamma IR/V_0\pi) + 8\gamma g_{mbias} R/9$. Also, for communications, phase noise is a critical parameter for measuring data transfer quality and reliability.

Essentially, Q indicates tank circuit efficiency, peak energy stored in the tank circuit (reactance, $X_L = j\omega_0 L$ and $X_C = -1/j\omega_0 C$) with respect to the average energy dissipated (in the tank circuit resistance R) at resonance, i.e., $Q = L/RC$. Low Q circuits are, therefore, lossy and more heavily damped. Thus, the higher the Q, the closer to ideal the local oscillator tank circuit. All oscillators have some inherent/parasitic resistance, e.g., from wiring, contacts and drivers, that lowers the tank circuit Q. Minimizing this inherent/parasitic tank circuit resistance and parasitic capacitance is a focus of oscillator design, as is otherwise compensating for any residual resistance and parasitic capacitance.

To offset inherent, parasitic resistance, a typical oscillator includes a pair of cross coupled devices (e.g., bipolar transistors, field effect transistors (FETs) or logic gates, such as inverters) connected to an LC tank circuit. The cross coupled devices add negative resistance as the LC oscillates, thereby providing regenerative feedback. However, the cross coupled devices may also add more resistance and/or more capacitance (which shifts the resonant frequency). Further, circuit component age and ambient conditions, e.g., operating voltage and temperature, can alter the characteristics of the oscillator to shift the resonant frequency away from nominal. A typical voltage controlled oscillator (VCO) is a tunable oscillator where a control voltage is adjusted to shift the VCO operating frequency, for example, to re-center the frequency and/or compensate for phase shift. For the state of the art voltage controlled oscillator, either the LC tank still drives output buffers directly or the LC capacitively drives the output buffers through a tapped capacitance network.

Figure 1A:
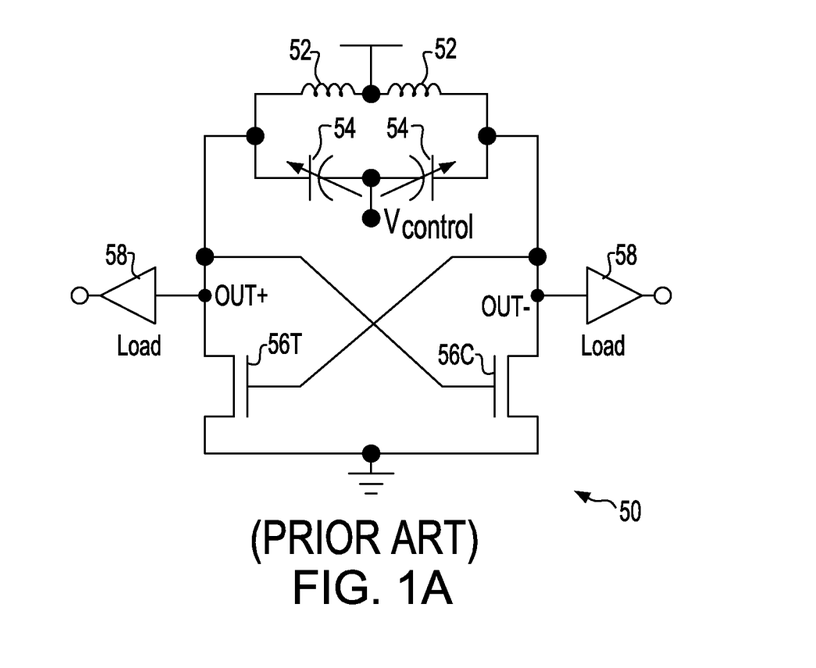
FIGS. 1A-B show simple examples of a typical conventional VCO.

FIG. 1A shows a simple example of a typical VCO 50. Each of a pair of identical tank circuits includes inductors 52 and a voltage variable capacitors (varactor) 54. In this example, the inductors 52 are connected to reference or supply voltage ($V_{dd}$) at one end and at the other end to varactors 54, which also are connected to, and controlled by, a control voltage ($V_{control}$), providing the voltage control. The LC tank circuits 52, 54 are each connected to the drain of one of a pair of cross coupled devices, N-type FETs (NFETs) 56T, 56C and a clock driver or buffer 58. The connection to buffers 58 is directly coupled to the tank LC. Alternately, the devices 56T, 56C may be P-type FETs (PFETs) with appropriate modification, i.e., swapping $V_{dd}$ and ground.

In VCO 50 the cross coupled devices 56T, 56C, essentially add negative resistance (i.e., device resistance) to the tank circuit. Both the devices in buffers 58 and wiring to the buffers 58, load the tank circuit (i.e., add capacitance and resistance), causing a frequency/phase shift that depends upon $C_{load}$. The tank circuit oscillates at a resonant frequency determined by the inductance (L) of the inductors 52 and $C_{load}$ added to varactor 54 capacitance (C) in response to the control voltage, i.e., $C_{p1} = C + C_{load}$. Bearing in mind that increasing parallel capacitance reduces circuit Q, $Q_{p1} < Q_0$, where $Q_0$ is the VCO Q factor without loading effects. Thus, the load of VCO 50, which is directly connected to the tank circuit, lowers Q to $Q_{p1}$, and directly affects oscillator frequency and phase noise.

Frequently, a single VCO 50 drives several output loads, which subjects the VCO to frequency drift known as load pushing. So, normally, the LC tank drives output buffers 58. The LC tank also is connected to the cross coupled oscillator devices 56T, 56C. The load on an oscillator may vary significantly from application to application depending on the number and/or size of buffers 58 being driven. For this directly coupled oscillator 50, this variation in tank circuit load can cause significant oscillation frequency variation and add to phase noise.

Figure 1B:
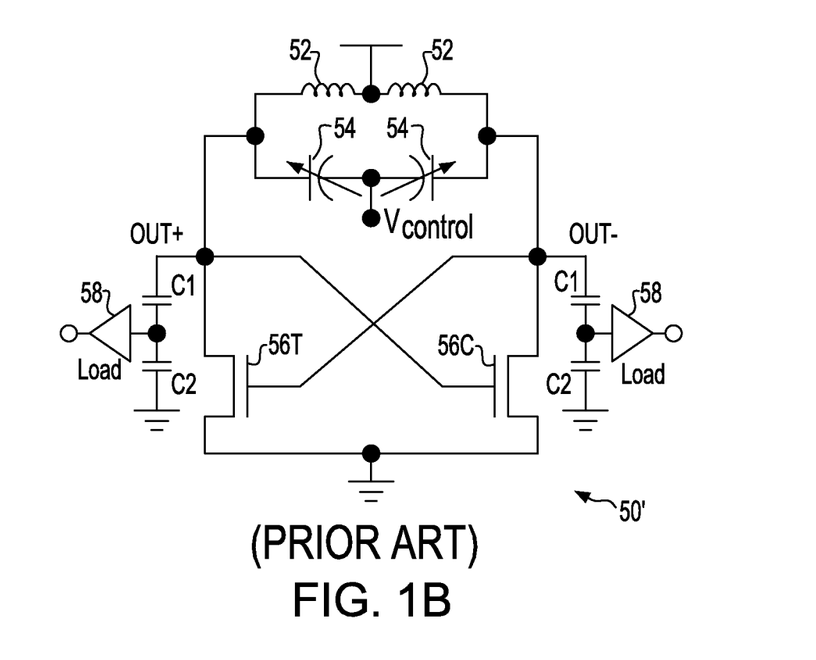

FIG. 1B shows an example of a tapped capacitance VCO 50'. The tapped capacitance VCO 50' has reduced load sensitivity because $C_{load}$ is not directly connected to the tank circuit. Instead, $C_{load}$ is connected to the tapped capacitance C1, C2, where C1<<C2. In particular, $C_{load}$ is connected in parallel with capacitor C2 (i.e., additively), and both are connected in series with C1 (inversely additively). The equivalent capacitance $C_{P2}$ loads the tank circuit according to $C_{P2} = C + C1//(C_{load} + C2)$. Thus, $C_{p2} << C_{p1}$ and $Q_0 \approx Q_{P2} >> Q_{P1}$.

Getting to this higher $Q_{P2}$, however, required adding the tap capacitors C1 and C2 for each output. Each capacitor C1, C2 requires additional chip area. A typical IC capacitor usually occupies a relatively large part of valuable chip area. This increases chip fabrication costs. Moreover, because wires passing over or adjacent to these capacitors C1, C2, adds parasitics that may introduce cross-talk to couple passing signals into the circuit and that may further change circuit Q in what may be unexpected ways. To avoid these parasitic changes, the area above, below and adjacent to the capacitors may need to be blocked off from wiring, further consuming valuable chip area.

Figure 2A:
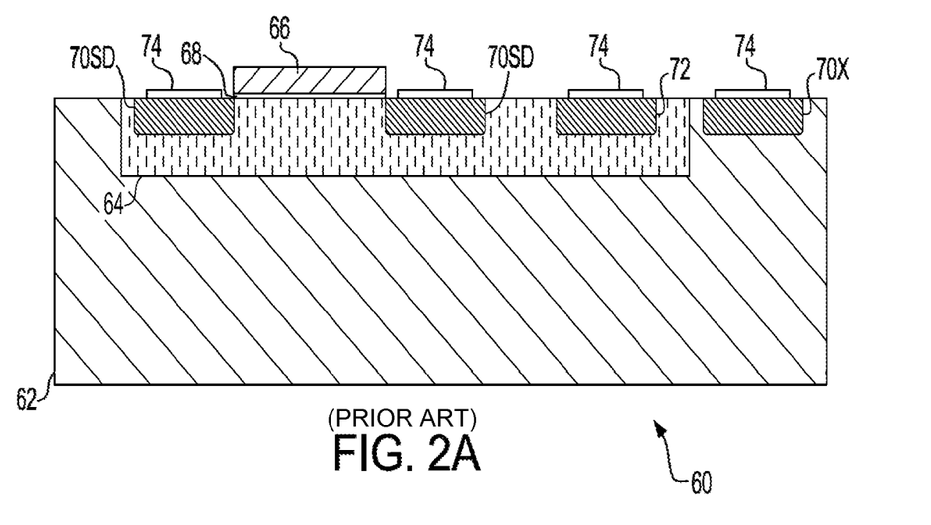
FIGS. 2A-B show simple cross-sectional examples of state of the art bulk and silicon on insulator (SOI) FETs.
Figure 2B:
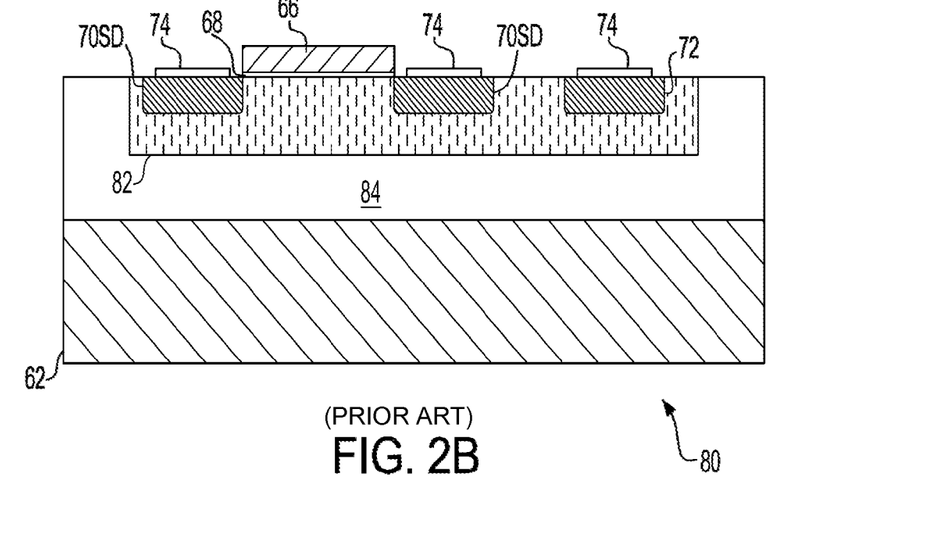

FETs 56T, 56C in the VCOs 50, 50' of FIGS. 1A-B are state of the art FETs such as the bulk FETs 60 or the silicon on insulator (SOI) FETs 80 shown simple cross-sectional examples of FIGS. 2A-B. A bulk FET 60 is formed in a wafer 62, e.g. a silicon wafer, body doped with a first dopant type, e.g., N-type for NFETs. A well 64 of the opposite dopant type (P-type in this example) is formed in the wafer 62, and although multiple devices may be made in the same well 64, in this example a single device 60 is formed in each well 64. A gate 66 is formed above gate oxide 68 on the wafer 62. Source/drain diffusions (N-type) 70SD are formed adjacent to the gates 66 and a substrate contact 70X is formed to the bulk wafer 62. In a typical CMOS fabrication process, well contact (N-type) 72 is formed when P-type source/drain regions are formed for opposite type devices, i.e., for PFETs. Although not shown here, source/drain extensions typically extend from the source/drain diffusions 70SD to the edge of the gate 66 and a self-aligned silicide (salacide) layer may be formed on the gates 66, diffusions 70SD, well contact 72 and substrate contact 70X to reduce circuit resistance. Wires 74, e.g., metal, vias, etc., are formed selectively on the salacided surface to connect the cross coupled devices together (connecting the gates 66 to diffusions 70) and to provide a bias (i.e., reverse bias) to the well 64 and to the substrate 62. Additional wiring (not shown) is normally formed above the surface in subsequent layers.

Each SOI FET 80 is formed in an island 82 isolated from the wafer 62. The island 82 is body doped substantially identically as well 64 for the bulk FET 60 and may support multiple FETs of the same type. Each island 82 is isolated from the wafer 62 by insulator/dielectric 84, e.g., buried oxide (BOX) and shallow trench isolation (STI). Although shown with a well (body) contact 72, under some circumstances this contact may be omitted, e.g., in the VCO 50 example of FIG. 1. If the body contact 72 is omitted, the device body (i.e., the doped island 82) is allowed to float.

In what is known as a back-gate (body contact) coupled VCO, the tank is capacitively coupled to, and may be cross coupled through, the bodies 72 of the VCO devices 60, 80. An example of a back-gate coupled VCO is provided by Kim et al. "A Very Low-Power Quadrature VCO with Back-Gate Coupling," *IEEE JOURNAL OF SOLID-STATE CIRCUITS*, VOL. 39, NO. 6, JUNE 2004, pp. 952-5.

Figure 3:
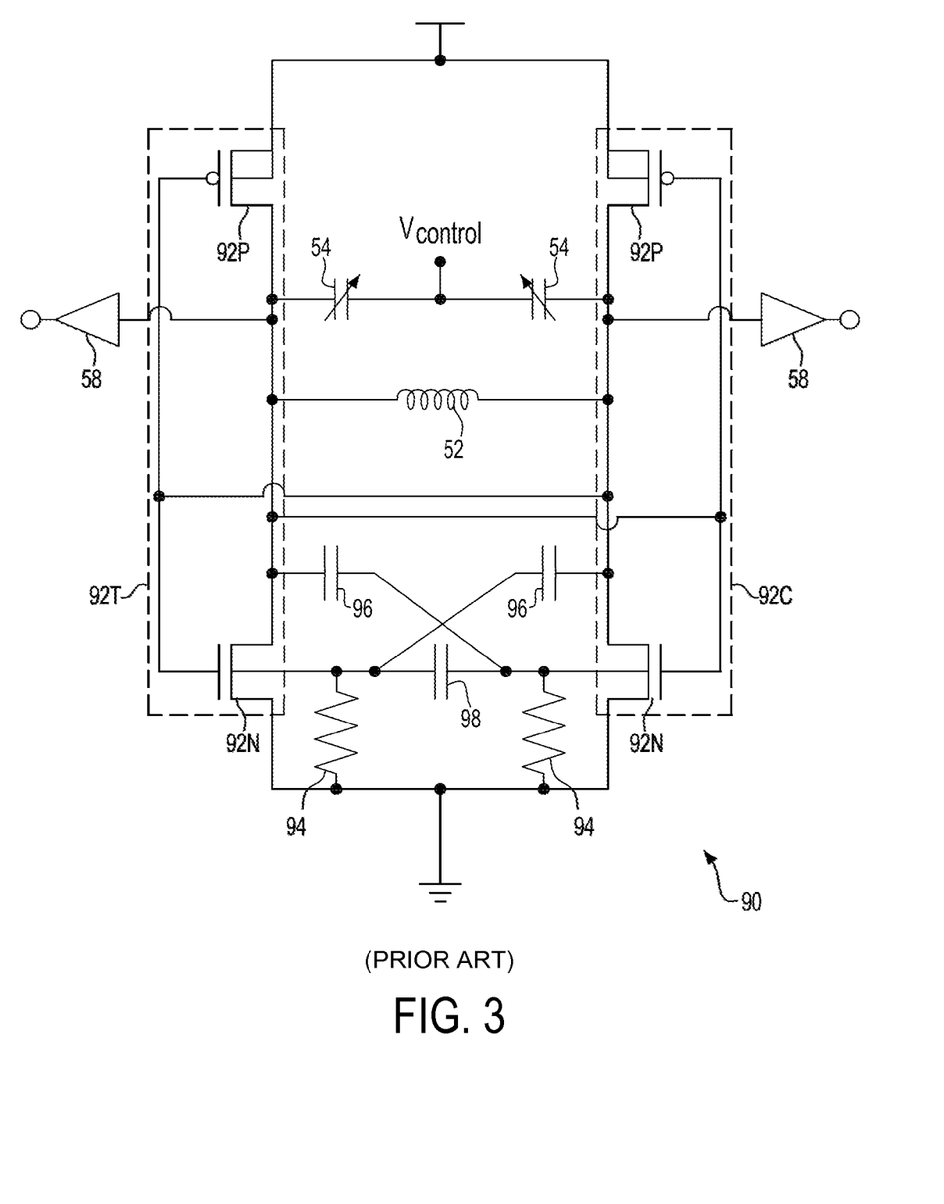
FIG. 3 shows an example of a back-gate coupled VCO.

FIG. 3 shows another example of a back-gate coupled VCO 90, described in more detail by U.S. Pat. No. 7,545,230 to Jong et al. In this example, instead of cross-coupled devices 56T, 56C in FIGS. 1A and 1B, the VCO includes a latch, i.e., a pair of cross-coupled CMOS inverters 92T, 92C. The tank circuit switches the cross-coupled inverters 92T, 92C, which drive the result rail to rail, i.e., between supply ($V_{dd}$) and ground, at the resonant frequency. Each inverter 92T, 92C includes a PFET 92P and an NFET 92N. The body contact (70X in FIGS. 2A and 2B) of the PFETs 92P is tied to the supply, i.e., tied body to source. The body of each NFET 92N is DC biased to ground through bias resistors 94. A capacitive network 96, 98 couples the signal from the tank circuit to the body of NFETs 92N.

Since FET turn-on is dependent on threshold voltage ($V_T$), which in part also controls current; and since device $V_T$ depends on device source to substrate voltage ($V_{SX}$); the coupled signal varies each NFETs $V_T$ to vary the point at which NFET current flows. Thus, shifting the NFET $V_T$ shifts the phase of the tank circuit. The back bias network (resistors 94 and capacitive network 96, 98) is coupled directly to the tank circuit. So, the back bias network itself capacitively and resistively loads the tank circuit, lowering the circuit Q and shifting the resonant frequency.

However, the LC tank still drives the load on these state of the art back-gate coupled VCOs, e.g., 90. Thus, the VCO load, which is primarily capacitive and secondarily resistive and driven by the LC tank, adds capacitance and resistance to the LC. As noted hereinabove, any added capacitance tends to shift the resonant frequency. As also noted, any added resistance lowers the LC tank Q.

Thus, there exists a need for a load insensitive RF oscillator for on-chip use in an IC, e.g., as a local RF source for a wired or wireless (e.g., WiFi) transceiver.

SUMMARY OF THE INVENTION

An aspect of the invention is a load tolerant RF oscillator that is not sensitive to load characteristics;

Another aspect of the invention is a load tolerant RF oscillator that does not require additional discrete capacitors to couple the base frequency from the tank circuit to output buffers/drivers;

Yet another aspect of the invention is a load tolerant RF oscillator that minimizes load induced phase changes/shifts.

The present invention relates to a voltage controlled oscillator (VCO), IC and CMOS IC including the VCO. The VCO includes an LC tank circuit and a pair of cross-coupled devices connected to the tank circuit and driving a pair of buffers. Each of the pair of cross-coupled devices includes a field effect transistor (FET) with independently controllable body, for example, body independently controllable PFET in twin well process, body independently controllable PFET and NFET in triple well process, body independently controllable FET in SOI process and body controllable BJT transistor. The tank circuit is coupled to the buffers solely through the FET drain to body capacitance. In an embodiment a VCO is implemented using a triple well process, with each triple well FET on the surface of the triple well structure. The body of the FET is the surface well, and the body connects to the substrate through diodes (cathode-anode or anode-cathode-anode, respectively for PMOS or NMOS) that are biased off. The present invention has applications to any FET technology with independently controllable body FETs.

An embodiment of the VCO comprises an LC tank circuit; a pair of cross coupled semiconductor devices, each semiconductor device comprising a triple well field effect transistor (FET), the body for each said FET being the surface well of a triple well structure, the FETs being cross coupled and said LC tank circuit being connected to the gates of the cross coupled FETs; and a pair of buffers, the input to each buffer being directly connected to said surface well.

An embodiment of the VCO comprises an LC tank circuit; a pair of cross coupled field effect transistors (FETs), the LC tank circuit solely connected to the drains of said pair of cross coupled FETs; a pair of triple wells in the surface of a semiconductor chip, each triple sell including a surface well at said surface; a pair of cross coupled field effect transistors (FETs), the body of each FET being a respective said surface well, the LC tank circuit solely connected to the drains of said pair of cross coupled FETs; and a pair of buffers, the input to each buffer being connected to one said surface well.

An embodiment of the CMOS integrated circuit (IC) chip includes at least one transceiver comprising: a receiver connectable to an external antenna for receiving a radio frequency (RF) signal and extracting an incoming baseband signal from received RF responsive to a base frequency; a voltage controlled oscillator (VCO) generating said base frequency, said VCO comprising: an LC tank circuit, a pair of cross-coupled FETs, each in the surface well of a triple well structure, the back-to-back diodes in said triple well structure being biased off, each surface well being the body of a respective FET, and a pair of buffers, the input to each buffer being connected to one said surface well; and a transmitter connectable to an external antenna for modulating said base frequency to an outgoing baseband signal and driving a connected said external antenna.

An embodiment of the CMOS integrated circuit (IC) chip includes at least one transceiver comprising: a receiver comprising: an antenna connection for connecting an external antenna, a low noise amplifier receiving a radio frequency (RF) signal from a connected said antenna and amplifying a received said RF signal, a mixer mixing the amplified RF from said low noise amplifier with a base frequency, and a low pass filter an extracting said baseband signal from said amplified RF mixed with said base frequency; a voltage controlled oscillator (VCO) generating said base frequency, said VCO comprising: an LC tank circuit, a pair of cross-coupled FETs on a pair of triple wells, the triple well junctions being biased off, the surface well of each triple well structure being the body of a respective FET, and a pair of buffers, the input to each buffer being connected to said surface well of one of said pair of triple wells; and; and a transmitter comprising: an antenna connection for connecting an external antenna, a power amplifier amplifying an outgoing RF signal and driving said external antenna responsive to said amplified RF, a modulator modulating said base frequency to an outgoing baseband signal and providing said outgoing RF signal, and a low pass filter filtering said outgoing baseband signal and passing the filtered signal to said modulator.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 4A:
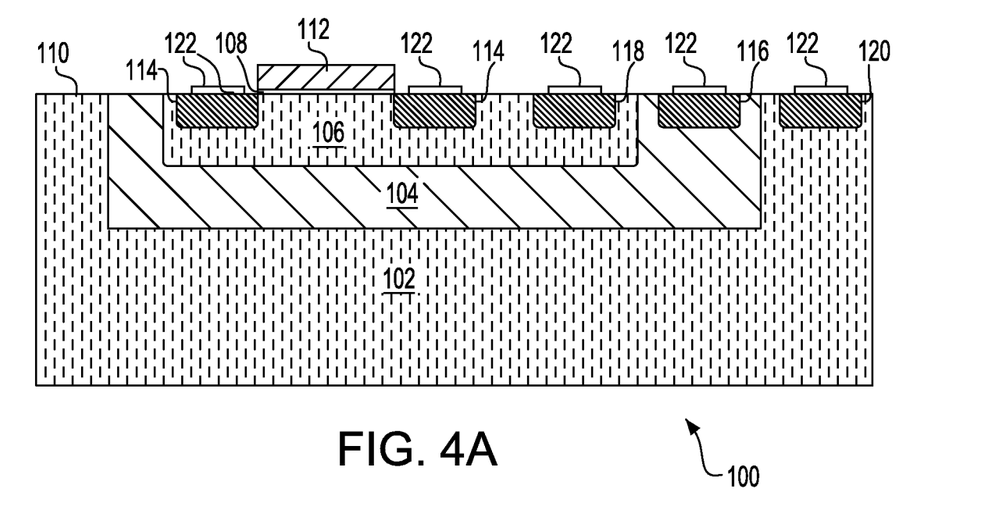
FIGS. 4A-B show a cross sectional example of a triple well device and a schematic representation of that device, for providing a high Q local oscillator frequency in a preferred back-gate loaded VCO.
Figure 4B:
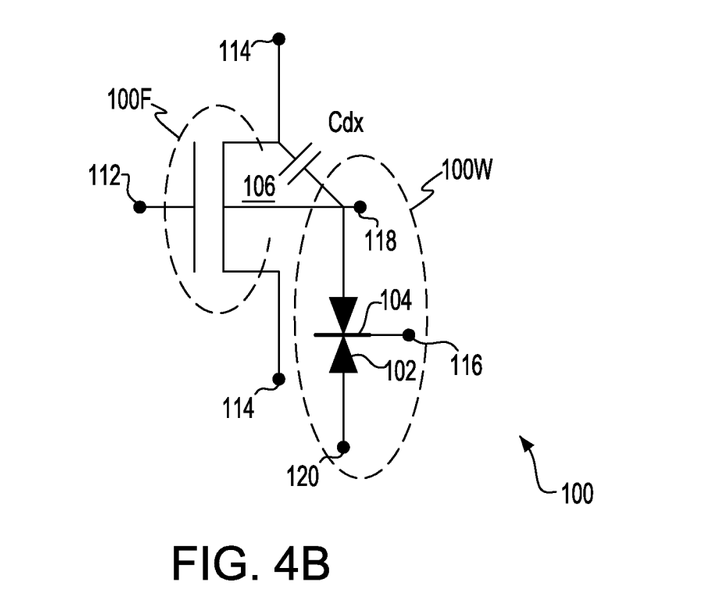

Turning now to the drawings and, more particularly, FIGS. 4A-B show a cross sectional example of an independently-controlled body device 100 and a schematic representation of that device, an N-type Field Effect Transistor (NFET) in this example, used in a back-gate loaded VCO, for providing a high Q local oscillator frequency according to a preferred embodiment of the present invention. In addition to using the SOI FET 80 of FIG. 2B, preferred VCO FETs may be on the surface of a multi-well structure, e.g., on a twin-well or triple well IC. So in this example, the FET 100F is on the surface of a triple well structure (P-N-P well in this example) 100W. The triple wells form back-to-back diodes (anode-cathode-anode) that are biased/tied off in operation to isolate the FET body, i.e., the surface well. Thus, the VCO FETs 80, 100 may be independently controlled, i.e., independent of other devices and adjacent layers.

Thus, in this example, the triple well structure 100W includes a P-type bulk substrate (e.g., a chip, substrate or a layer of a silicon on insulator (SOI) wafer or chip) 102 that is the anode of one diode. An N-type well 104 is the cathode of the back-to-back diodes. The body of each FET 100F is a P-type well 106, which is the anode of the other diode.

The FET 100F includes thin gate oxide 108 on upper surface 110 and a gate 112 on the gate oxide 108 on the body well 106. Source/drain diffusions (N-type) 114 are formed in the body well 106, adjacent to the gate 112. A cathode well contact (also N-type) 116 provides a connection to the anode well 104. Typical source/drain extensions (not shown) extend from the source/drain diffusions 114 to the edge of the gate 112. A body contact (P-type) 118 provides a connection to the body well 106. A salacide layer (also not shown) may be formed at least on the gates 112 and source/drain diffusions 114. A substrate contact 120 is formed to the bulk substrate 102 on the upper surface 110 in this example. Wires 122, e.g., metal, vias, etc., are formed connecting to device terminals. Alternately, the preferred triple well device 100 may be a PFET formed on an NP diode transistor by swapping region types, N for P and P for N.

It is well known that each PN junction has inherent capacitance dependent upon the junction size, characteristics (e.g., doping gradient) and operating conditions (e.g., junction voltage). A reverse biased (off) PN junction passes negligible DC current, and so, normally appears as just a capacitor. In normal operation, each source/drain diffusion 114 is reverse biased and appears as an inherent capacitance between the diffusion 114 and the body 106, $C_{dx}$. $C_{dx}$ depends on FET size and manufacturing technology and may range from several femtoFarads (fF) to several picoFarads (pF) and, preferably, is 15 fF in this example. Likewise, by coupling the common cathode 104 high to bias both of the back-to-back diodes 100W off, each of the junctions appear as a capacitance between the common cathode 104 and each anode 102, 106. Thus biased, these off junctions appear as a pair of capacitors, anode to bulk substrate ($C_{ab}$), and anode to body ($C_{xa}$). Both $C_{ab}$ and $C_{xa}$ are typically orders of magnitude larger than $C_{dx}$, and depend on FET size and manufacturing technology. While $C_{ab}$ and $C_{xa}$ may range from several femtoFarads to several picoFarads, preferably, in this example both are around 20 fF. With the devices 100 thus biased, the contact 118 to the FET body 106 is the output terminal, i.e., the back-gate terminal for driving a load for a preferred back-gate loaded VCO.

Figure 5:
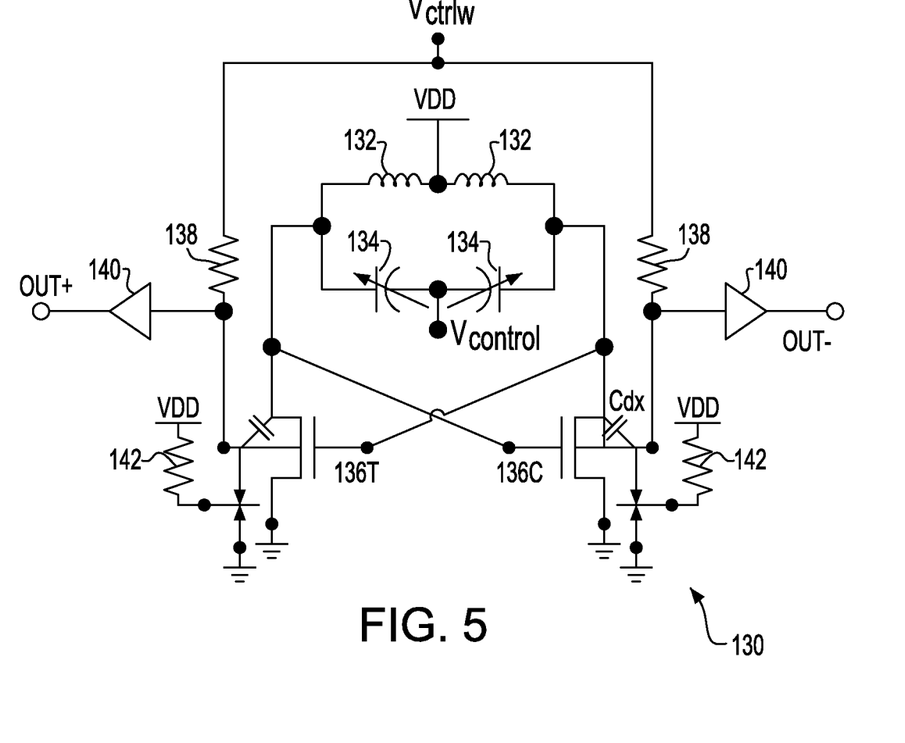
FIG. 5 shows an example of a back-gate loaded VCO using triple well devices according to a preferred embodiment of the present invention.

Accordingly, FIG. 5 shows an example of a back-gate loaded VCO 130 using triple well devices according to a preferred embodiment of the present invention with reference to individual device 100 of FIGS. 4A-B. A pair of tank circuits each include an inductor 132, 700 picoHenries (700 pH) in this example, and a voltage variable capacitor (varactor) 134, preferably, 150 fF in this example. The tank circuits are each tied between a reference or supply voltage ($V_{dd}$, 0.5-1.5 Volts (1.5V)) at the inductor 132 and a control voltage ($V_{control}$) at the varactor 134. The common inductor 132—varactor 134 connection of each tank circuit is connected to the drain of one of a cross coupled pair of N-type preferred triple well devices 136T, 136C. In another embodiment, the devices 136T, 136C may be PFETs with appropriate modification, i.e., swapping $V_{dd}$ and ground.

In this example, the back-to-back diode transistor 100W of each device 136T, 136C is tied off by coupling the cathode well 104 to $V_{dd}$ through resistors 142 connected at contact 116. The bulk substrate cathodes 102 are grounded. Buffers 140 are driven from each device 136T, 136C FET body 106 and biased at a bias/control voltage ($V_{ctrlw}$) through bias resistors 138. Preferably, bias resistors 138, 142, which may be 1-10 kiloOhms (10 kΩ), are 5 kΩ in this example. Preferably, $V_{ctrlw}$ is selected as $V_{dd}/2$. The 15 fF drain to body capacitance ($C_{xa}$), i.e., 114 to 106, drives buffers 140 from the connected body contacts 118.

The common cathode 104 of the back-to-back diodes 100W of both devices 136T, 136C is tied high (to $V_{dd}$) through resistors 142 at contacts 116. With the device back-to-back diodes 100W tied/biased off, the series of reverse biased junction capacitances ($C_{dx}$, $C_{xa}$, $C_{ab}$) and $C_{load}$ (where $C_{load}$ ranges from 100-200 fF in this example) act as a voltage divider, providing a portion of the tank signal ($V_{L,C}$) to the loads 138 ($V_x$) with the input to load buffers 138 being $V_{ctrlw}$+ $V_x$. The source to body capacitance (not shown) may be considered as included in $C_{load}$. The drain junction is smaller than the anode well 104 junctions and, $C_{dx} < C_{xa} + C_{ab}$. The 5 kΩ cathode bias resistors 142 are selected low enough for a relatively long RC, such that the anode voltage is effectively constant at or slightly below $V_{ctrlw}$. So, essentially the entire tank circuit signal is across the body capacitances, $C_{dx}$ and $C_{xa}$. Thus, the signal to the load $V_x = C_{dx} V_{L,C}/(C_{dx}//(C_{load} + C_{ac}))$; and for $C_{load} >> C_{dx}$, $C_{xa}$, $C_{ab}$, $V_x \approx V_{ctrlw} + (C_{dx}/C_{load}) V_{L,C}$. So typically, $V_{ctrlw}$ is selected at or near the switching point of the load buffer 138, i.e., $\sim V_{dd}/2$. The source of each respective NFET 100F is grounded. The NFET source diffusion diode clamps the body 106 at an upper limit above ground to the diode turn on voltage.

With the back-to-back diode 100W of devices 136T, 136C tied off, the series of reverse biased junction capacitances ($C_{dx}$, $C_{xa}$, $C_{ab}$) add capacitance to the tank circuit varacter 134 (C). So, for this embodiment the equivalent capacitance $C_{P3} = C + C_{dx}//(C_{load} + C_{xa}//C_{ab})$. So, where $C_{dx} << C_{load}$, $C_{P3} \approx C + C_{dx}$. In comparison to the prior art VCO 50 of FIG. 1A, $C_{p3} << C_{p1}$ and $Q_0 \approx Q_{P3} >> Q_{P1}$. Further this result is achieved without adding elements, e.g., C1, C2 of the example of FIG. 1B above.

Figure 6:
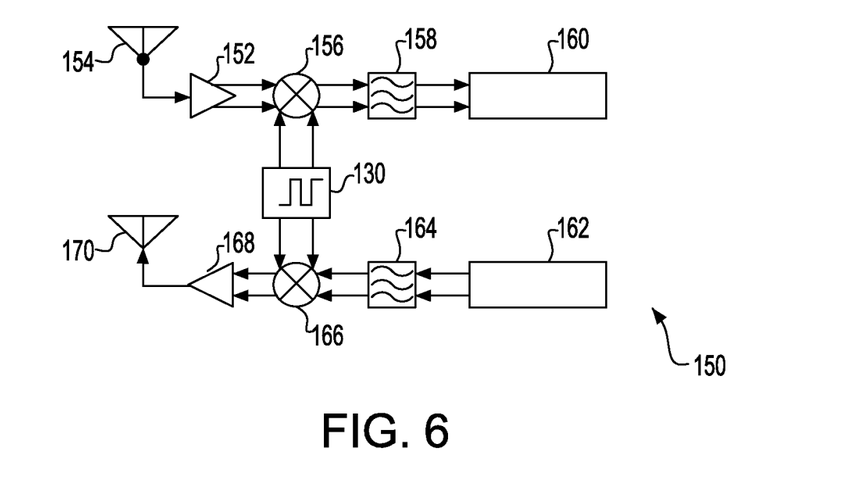
FIG. 6 shows an example of a transceiver with a preferred local oscillator.

FIG. 6 shows an example of a transceiver 150 with a preferred local oscillator (LO) VCO 130 on an integrated circuit (IC) chip, e.g., a CMOS or BiCMOS IC. On the receiver side, a low noise amplifier (LNA) 152 senses an incoming radio frequency (RF) signal from an antenna 154. The LNA 152 passes the signal for demodulation in mixer 156 and low pass filter 158, which provides a baseband signal/data to chip circuits 160. On the transmitter side, baseband signal/data from chip circuits 162 passes through low pass filter 164 to mixer 166 for modulation with the base frequency from the local oscillator 130. The modulated signal passes to power amplifier 168 for transmission from antenna 170.

Figure 7A:
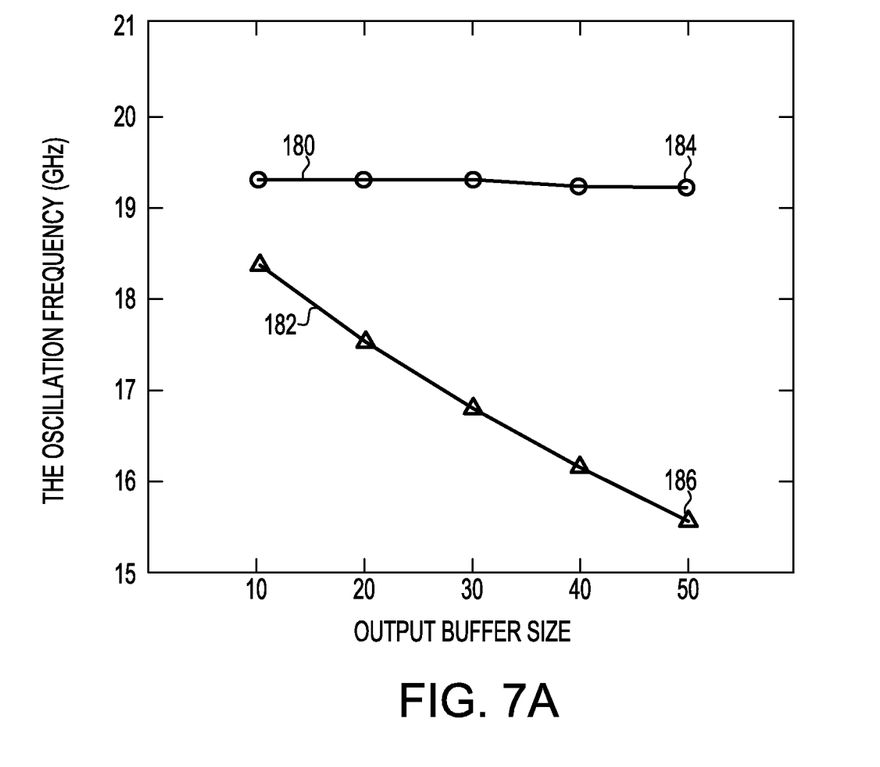
FIG. 7A shows a graphical comparison of the preferred VCO performance with the performance for a prior art VCO.
Figure 7B:
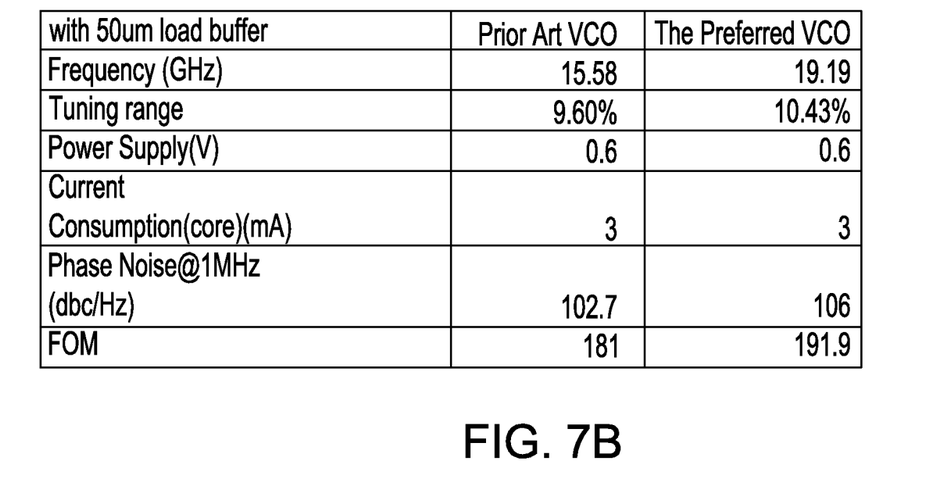
FIG. 7B shows a table comparing the circuit characteristics for the preferred VCO and a prior art VCO both driving a 50 µm buffer load.

FIG. 7A shows a graphical comparison of performance 180 of the preferred VCO 130 with the performance 182 for the prior art VCO (50 of FIG. 1A), and the table of FIG. 7B compares the circuit characteristics for the VCOs 130, 50 driving a 50 μm buffer load at points 184, 186, respectively.

It is apparent that compared with the conventional prior art VCO 50, a preferred VCO 130 maintains uniform oscillation frequency even with output buffer 140 device size variation, varying only 0.44%. With the load varied (i.e., output buffer 58 device being changed) from 10 um to 50 um, the oscillation frequency of the conventional VCO 50 varies from 5% to 27.72%, 17.7% in this example. Moreover, the preferred VCO 130 averages 3 dB phase noise improvement over the conventional VCO 50 over the entire tuning range.

Advantageously, a preferred VCO is a high-performance, load-insensitive RF VCO. Further, the effects of loading is minimized and without requiring additional components (a tapped capacitor), with minimal load induced phase changes/shifts. Instead, the LC tank is simultaneously isolated from, and coupled to, the load only through the relatively small drain-to-body capacitance of the cross-coupled pair. The drain-to-body capacitance is one capacitor in a capacitive network that includes the source/drain junction and junction capacitances of off triple well back-to-back diodes. A preferred VCO can be implemented in any standard triple well, bipolar and SOI CMOS, NMOS or PMOS process where the body may be isolated from other process layers.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A voltage controlled oscillator (VCO) comprising:
   an LC tank circuit;
   a pair of cross coupled semiconductor devices, each semiconductor device comprising a field effect transistor (FET) with an independently controlled body, the FETs being cross coupled and said LC tank circuit being connected to the gates of the cross coupled FETs;
   a pair of buffers, the input to each buffer being directly connected to said body of a respective said FET, wherein each said body is a surface well;
   a first pair of resistors, each connected between a supply voltage and a second well, one said surface well being in said second well; and
   a second pair of resistors, each connected between a second control voltage and another said surface well, wherein said LC tank circuit is coupled to each of said buffers solely through capacitance between the respective FET drain and the respective said surface well.

2. A VCO as in claim 1, wherein each said surface well is the surface well of a twin well structure in a twin well integrated circuit (IC) chip.

3. A VCO as in claim 1, wherein each said surface well is the surface well of a triple well structure, the triple wells being P-type and N-type wells forming back-to-back diodes in a triple well integrated circuit (IC) chip.

4. A VCO as in claim 3, wherein said VCO is a local oscillator (LO) on an integrated circuit (IC) chip, and back diodes in said triple wells in said pair are biased off.

5. A VCO as in claim 4, wherein said IC chip is a CMOS IC further comprising at least one transceiver including said LO VCO.

6. A VCO as in claim 1, wherein said LC tank circuit comprises a pair of inductors connected at one end to a supply voltage and a pair of voltage variable capacitors (varactors) connected at one end to a control voltage, each inductor connected at the other end to one of said pair of varactors and the drain of one of said cross coupled FETs.

7. A voltage controlled oscillator (VCO) comprising:
   an LC tank circuit;
   a pair of triple wells in the surface of a semiconductor chip, each triple well including a surface well at said surface;

a pair of cross coupled field effect transistors (FETs), the body of each FET being a respective said surface well, the LC tank circuit connected to the drains of said pair of cross coupled FETs;

a pair of buffers, the input to each buffer being connected to one said surface well;

a first pair of resistors, each connected between a supply voltage and a second well; and a second pair of resistors, each connected between a second control voltage and one said surface well, wherein said LC tank circuit is coupled to each of said buffers solely through the respective FET drain to surface well capacitance.

8. A VCO as in claim 7, wherein each of said pair of triple wells comprise a P-type well (P-well), an N-type well (N-well) in said P-well and a P-type surface well in said N-well, said FET being an NFET having a P-type body.

9. A VCO as in claim 7, wherein said VCO is a local oscillator (LO) on a CMOS integrated circuit (IC) chip, and said LC tank circuit comprises a pair of inductors connected at one end to a supply voltage and a pair of voltage variable capacitors (varactors) connected at one end to a control voltage, each inductor connected at the other end to one of said pair of varactors, each said other end being connected solely to said pair of cross coupled FETs.

10. A VCO as in claim 9, wherein said CMOS IC chip further comprises at least one transceiver including said LO VCO.

11. A CMOS integrated circuit (IC) chip including at least one transceiver comprising:
a receiver connectable to an external antenna for receiving a radio frequency (RF) signal and extracting an incoming baseband signal from received RF responsive to a base frequency;
a voltage controlled oscillator (VCO) generating said base frequency, said VCO comprising:
an LC tank circuit,
a pair of cross-coupled FETs, each in the surface well of a triple well structure, the back-to-back diodes in said triple well structure being biased off, each surface well being the body of a respective FET,
a pair of buffers, the input to each buffer being connected to one said surface well,
a first pair of resistors, each connected between a supply voltage and a second well, said surface well being in said second well, and
a second pair of resistors, each connected between a second control voltage and one said surface well, wherein said LC tank circuit is coupled to each of said buffers solely through the respective FET drain to surface well capacitance; and
a transmitter connectable to an external antenna for modulating said base frequency to an outgoing baseband signal and driving a connected said external antenna.

12. A CMOS IC as in claim 11, wherein said LC tank circuit comprises a pair of inductors connected at one end to a supply voltage and a pair of voltage variable capacitors (varactors) connected at one end to a control voltage, each inductor connected at the other end to one of said pair of varactors and the drain of one of said cross coupled FETs.

13. A CMOS IC as in claim 11, wherein said pair of the triple wells are P-type and N-type wells forming back-to-back diodes in a triple well integrated circuit (IC) chip.

14. A CMOS IC as in claim 13, wherein said surface well is P-type and said FETs are NFETs.

15. A CMOS IC as in claim 11, said receiver comprising:
an antenna connection for connecting said external antenna;
a low noise amplifier amplifying a received said RF signal from said antenna connection;
a mixer mixing the amplified RF from said low noise amplifier with said base frequency; and
a low pass filter extracting said baseband signal from said amplified RF mixed with said base frequency.

16. A CMOS IC as in claim 11, said transmitter comprising:
an antenna connection for connecting said external antenna;
a power amplifier amplifying an outgoing RF signal and driving said external antenna responsive to said amplified RF;
a modulator modulating said base frequency to said outgoing baseband signal and providing said outgoing RF signal; and
a low pass filter filtering said outgoing baseband signal and passing the filtered signal to said modulator.

17. A CMOS integrated circuit (IC) chip including at least one transceiver comprising:
a receiver comprising:
an antenna connection for connecting an external antenna,
a low noise amplifier receiving a radio frequency (RF) signal from a connected said antenna and amplifying a received said RF signal,
a mixer mixing the amplified RF from said low noise amplifier with a base frequency, and
a low pass filter an extracting said baseband signal from said amplified RF mixed with said base frequency;
a voltage controlled oscillator (VCO) generating said base frequency, said VCO comprising:
an LC tank circuit,
a pair of cross-coupled FETs on a pair of triple wells, the triple well junctions being biased off, the surface well of each triple well structure being the body of a respective FET, and
a pair of buffers, the input to each buffer being connected to said surface well of one of said pair of triple wells,
a first pair of resistors, each connected between a supply voltage and a second well of one of said pair of triple wells, and
a second pair of resistors, each connected between a second control voltage and one said surface well, wherein said LC tank circuit is coupled to each of said buffers solely through the respective FET drain to surface well capacitance; and
a transmitter comprising:
an antenna connection for connecting an external antenna,
a power amplifier amplifying an outgoing RF signal and driving said external antenna responsive to said amplified RF,
a modulator modulating said base frequency to an outgoing baseband signal and providing said outgoing RF signal, and
a low pass filter filtering said outgoing baseband signal and passing the filtered signal to said modulator.

18. A CMOS IC as in claim 17, wherein said LC tank circuit comprises a pair of inductors connected at one end to a supply voltage and a pair of voltage variable capacitors (varactors) connected at one end to a control voltage, each inductor connected at the other end to one of said pair of varactors and the drain of one of said cross coupled FETs.

19. A CMOS IC as in claim 17, wherein said the triple wells are P-type and N-type wells forming back-to-back diodes in a triple well integrated circuit (IC) chip.

20. A CMOS IC as in claim 19, wherein said surface well is P-type and said FETs are NFETs.

* * * * *